United States Patent [19]
McPherson et al.

[11] Patent Number: 5,096,676
[45] Date of Patent: Mar. 17, 1992

[54] CRYSTAL GROWING APPARATUS

[76] Inventors: Alexander McPherson, 11517 Tulane Ave.; Daniel Morris, 1152 Athena Ct., both of Riverside, Calif. 92507

[21] Appl. No.: 563,670

[22] Filed: Aug. 2, 1990

Related U.S. Application Data

[63] Continuation of Ser. No. 303,810, Jan. 27, 1989, abandoned.

[51] Int. Cl.$^5$ .................. B01D 9/02; C30B 35/00
[52] U.S. Cl. .................... 422/245; 422/102; 156/DIG. 62; 156/DIG. 113
[58] Field of Search ....... 156/62, 607, 608, DIG. 113; 206/521.1, 521.2, 521.9, 562, 568, 521.6; 422/109, 104, 245

[56] References Cited

U.S. PATENT DOCUMENTS

| | | | |
|---|---|---|---|
| 2,366,886 | 1/1945 | Van Tuyl | 206/562 |
| 3,649,464 | 3/1972 | Freeman | 206/558 |
| 4,154,795 | 5/1978 | Thorne | 206/562 |

OTHER PUBLICATIONS

Auduyeusky et al., "Technological Experiments Aboard Salyut-5", *ACTA Astronautica*, vol. 7, pp. 867-876.

*Primary Examiner*—Gary P. Straub
*Attorney, Agent, or Firm*—Edward S. Irons

[57] ABSTRACT

An apparatus for growing diffraction quality, protein crystals by vapor diffusion techniques. The apparatus includes a plurality of equilibrating solution reservoirs each having a side wall terminating in a top wall disposed in a first plane; a column disposed within each of the equilibrating solution reservoirs, each column having a protein solution receptacle including a side wall terminating in a top wall disposed in a second plane spaced from the first plane; and a cover having a nongreasy adhesive on one surface therof for sealable engagement with the top walls of the equilibrating solution reservoirs for sealing the reservoirs relative to atmosphere.

12 Claims, 2 Drawing Sheets

CRYSTAL GROWING APPARATUS

BACKGROUND OF THE INVENTION

Field of the Invention

The present invention relates generally to an apparatus for growing crystals. More particularly, the invention concerns an apparatus for growing diffraction quality, protein crystals by vapor diffusion techniques.

Discussion of the Invention

Crystallography is a powerful analytical tool which provides precise and detailed descriptions of the structure of molecules. Over the last thirty years, small molecule crystallography has been successfully integrated into chemical research at both the basic and industrial levels. Crystallography of macromolecules is now increasingly being viewed as the ultimate analytic tool of life scientists and is expected to play a very significant role in the biotechnology revolution.

In the past, several major technical difficulties have prohibited the routine use of macromolecular cyrstallography and its complete integration into the mainstream of biological sciences. These include problems associated with data collection from X-ray diffraction instrumentation, the computational analysis of the data, and the actual growing of the crystals. The successful introduction of are detectors for the extremely rapid collection of data has significantly reduced the data collection problems. Similarly, the enormous increase in computing power and the development of sophisticated computer graphic displays have substantially reduced the problems associated with computational analysis of the data. The remaining problem, crystallization, was initially circumvented by analyzing only those macromolecules which could be obtained in abundance and which crystallized readily. The structures of macromolecules possessing those qualities have long since been solved and today, the crystallization step remains the last major barrier to the routine structural analysis of commercially significant macromolecules.

One of the most common prior art vapor diffusion methods for growing crystals is the so-called "sitting drop" method and uses a glass plate with a plurality of depressions that act as wells for the protein drops. The plates are expensive and therefore are typically washed and siliconized for every trial. A clear plastic sandwich box is typically used for the equilibration chamber. The glass plate is placed on an inverted petri dish to elevate it above the solvent in the chamber and is then sealed with grease. The carrier contains protein drops equal in number to the depressions in the plate and each drop is equilibrated against the same solvent reservoir.

Another prior art method, sometimes called the "hanging drop" method, uses a multi-well plastic cell culture plate. This method allows a single protein drop to equilibrate against its own unique solvent, as opposed to all protein samples equilibrating against the same solvent, as is the case in the "sandwich box" method. In the "hanging drop" method, each drop is placed on a glass cover slip, which is carefully inverted and placed over a greased well to seal it. This "hanging drop" method is generally superior to the "sitting drop" method, but is quite awkward and significant problems are presented in removing the crystal from the greasy cover slip.

Still another prior art vapor diffusion method for growing crystals is the so-called "sandwich drop" method. In accordance with this method, the equilibrating solution is contained within a suitable reservoir and the protein drop is sandwiched between two glass plates which are sealed in position within the apparatus using vacuum diffusion pump oil. The technique of forming the sandwiched drop with parallel flat surfaces perpendicular to the light path provides improved microscopic viewing. However, this method is costly, somewhat tedious and the necessity of using a sealing medium such as pump oil provides an undesirable source of possible contamination. Further, the requirement for sealing two glass plates substantially increases the risk of vapor leaks causing the protein drops to dry out.

The aforementioned prior art, manual methods clearly illustrate the fact that, to date, the crystallization of proteins has been largely an empirical practice. The probability of success of the particular prior art method is often proportional to the number of trial samples composed. Frequently, the total number of variables such as concentrations of protein, salt, and inhibitors along with physical parameters, such as temperature, require many thousands of attempts in order to properly sample all the possibilities and combinations. Success, if it is achieved at all, sometimes demands a nearly intolerable amount of technical application and hundreds of hours of tedious human effort.

To obviate the labor intensive requirements of the prior art methods, attention in the field has turned to automation of the crystallization trial procedure. Systems for this purpose, for both dispensing the trial solutions and their later analysis for the presence of crystals, have been designed using a variety of robotic and optical scanning procedures However, for various reasons, the prior art methods do not easily lend themselves to automation. For example, robots have substantial difficulty in manipulating small glass components and properly sealing containers with sealing mediums such as oil and grease. Further, the prior art apparatus is generally not compatible with automatic pipetting equipment, or with automated optical systems used for data collection. Additionally, because of the basic design of the prior art apparatus, the kinetics of the equilibrium process are often difficult to control and reproduce.

The apparatus of the present invention overcomes many of the drawbacks of the prior art methods and devices by providing novel crystal growing apparatus which is inexpensive, easy to use and readily compatible with automatic pipetting, sample preparation and diffraction analysis equipment. Because of the unique design of the apparatus, laboratory technicians with no particular skills, or specialized training, can use the apparatus to grow high quality crystals in very large numbers for numerous uses, including the diffraction analysis of macromolecular structures.

SUMMARY OF THE INVENTION

It is an object of the present invention to provide an apparatus for growing protein crystals by vapor diffusion in which a multiplicity of crystals of precise size can simultaneously be grown with each crystal being grown within its own equilibrium solvent chamber.

Another object of the invention is to provide an apparatus of the aforementioned character in which each equilibrium solvent chamber is individually sealed by a readily removable sealing membrane without the need to use any type of sealing oils or greases.

Another object of the invention is to provide an apparatus of the character described in the preceding paragraph in which each protein drop is stratically supported within its solvent chamber on an upstanding column having an upper receptacle of optimum configuration to contain the particular protein drop.

A further object of the invention is to provide an apparatus for growing protein crystals in which the drop supporting columns and the equilibrium solvent chambers are integrally formed from a clear, non-wetting plastic having superior optical properties.

Still another object of the invention is to provide an apparatus of the class described which is easy to manipulate and stack and one which is readily usable with automated handling, pipetting and optical analysis equipment.

Another object of the invention is to provide an apparatus as described in the preceding paragraphs which can be inexpensively fabricated, thereby making it economically feasible to dispose of the apparatus after use.

Another object of the invention is to provide an apparatus for growing protein crystals in which the solvent is maintained within the equilibrium chambers of the device by a porous, foam material closely fitted into the equilibrium chambers.

DESCRIPTION OF THE INVENTION

Figure 3:
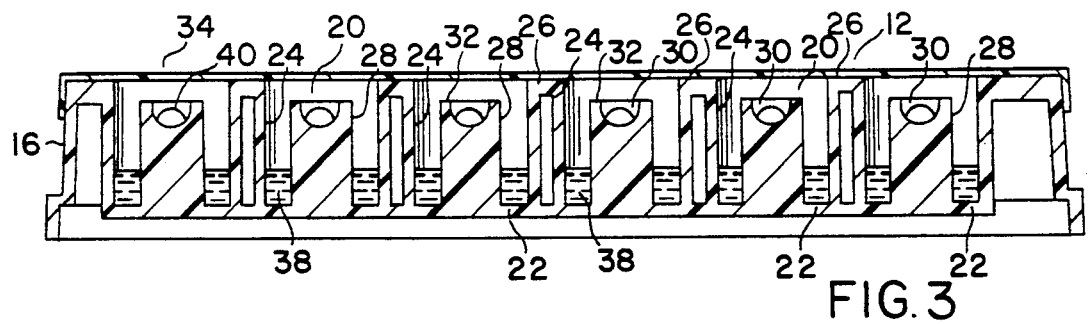
FIG. 3 is a cross-sectional view taken along lines 3—3 of FIG. 2.

Referring to the drawings, and particularly to FIGS. 1 through 4, one form of apparatus of the present invention for growing protein crystals is there illustrated and generally designated by the numeral 12. In this embodiment of the invention, the apparatus comprises interconnected side and end walls 14 and 16 respectively, which are integrally formed to define an interior enclosure 18. Each of the end and side walls terminate in a top wall, or edge, 14a and 16a respectively, which are disposed within a first plane. Formed interiorly of the side and end walls are a plurality of equilibrating solution reservoirs 20. As best seen by referring to FIGS. 3 and 4, each of the equilibrating solution reservoirs 20 includes a bottom wall 22 and a upstanding side wall 24 which terminates in an edge or top wall 26. Walls 24 are preferably generally cylindrical in shape. As indicated in FIG. 3, top walls 26 of each of the equilibrating solution reservoirs is, also, disposed within the first plane in a coplanar relationship with the top walls 14a and 16a of side and end walls 14 and 16.

Centrally located within each equilibrating solution reservoir 20 is an upstanding, generally cylindrically shaped column 28. Each column 28 includes, proximate the top thereof, a generally cup-shaped, protein solution carrying receptacle 30 having a wall terminating in an edge, or top wall, 32 which is disposed in a second plane spaced apart from the first plane of the top edges of the side and end walls. With this construction, top walls 32 are located substantially below the previously identified first plane.

A thin pliable cover 34, having an adhesive material on the lower surface thereof, is movable into sealable engagement with the top walls 14a and 16a of the apparatus and, also, into sealable engagement with the top walls 26 of each of the equilibrating solution reservoirs 20. With the cover 34 in position over the apparatus in the manner shown in FIGS. 3 and 4, each of the equilibrating solution reservoirs 20 is effectively sealed with respect to atmosphere. Cover 34 can be constructed of any suitable, thin plastic material, but a Mylar material having an adhesive on the lower surface thereof has proven quite satisfactory. Such a material is manufactured by the Corning Company and is sold under the name and style "Crack and Peel Mylar Sheeting."

In the preferred form of the apparatus, the side walls, end walls, equilibrating solution reservoirs and columns are all integrally formed by an injection molding process from a clear moldable plastic such as polystyrene. Other materials can be used to mold the apparatus but an optically clear, non-wetting plastic is, for reasons presently to be discussed, highly desirable. Further, the plastic material selected should be moldable in a manner such that the inner surfaces of the protein solution receptacles have a smooth texture.

Figure 1:
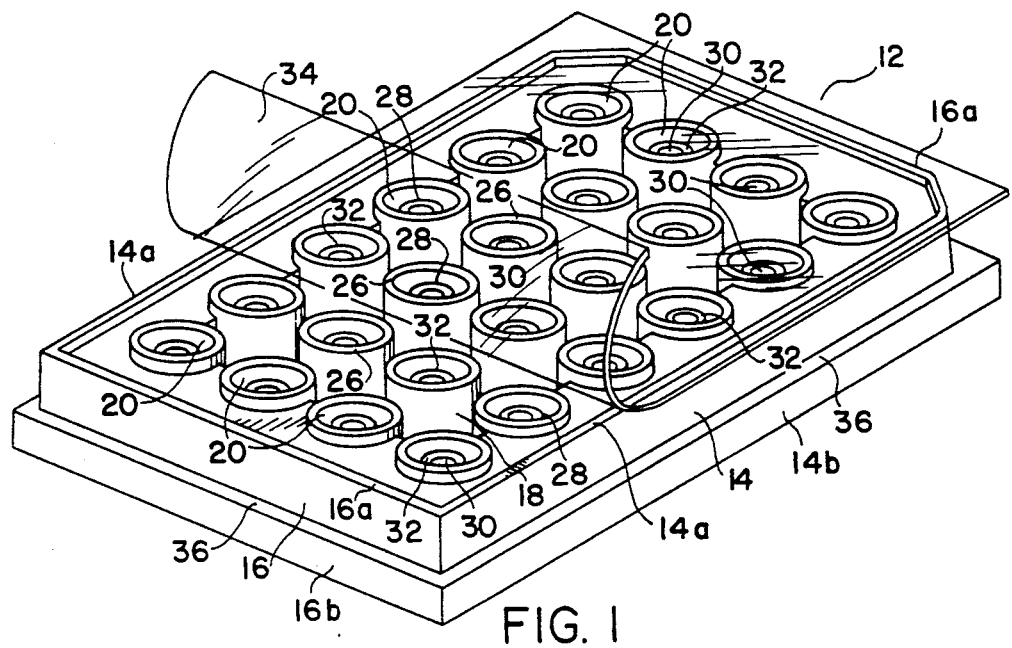
FIG. 1 is a generally perspective view of the apparatus of the present invention for growing protein crystals.
Figure 2:
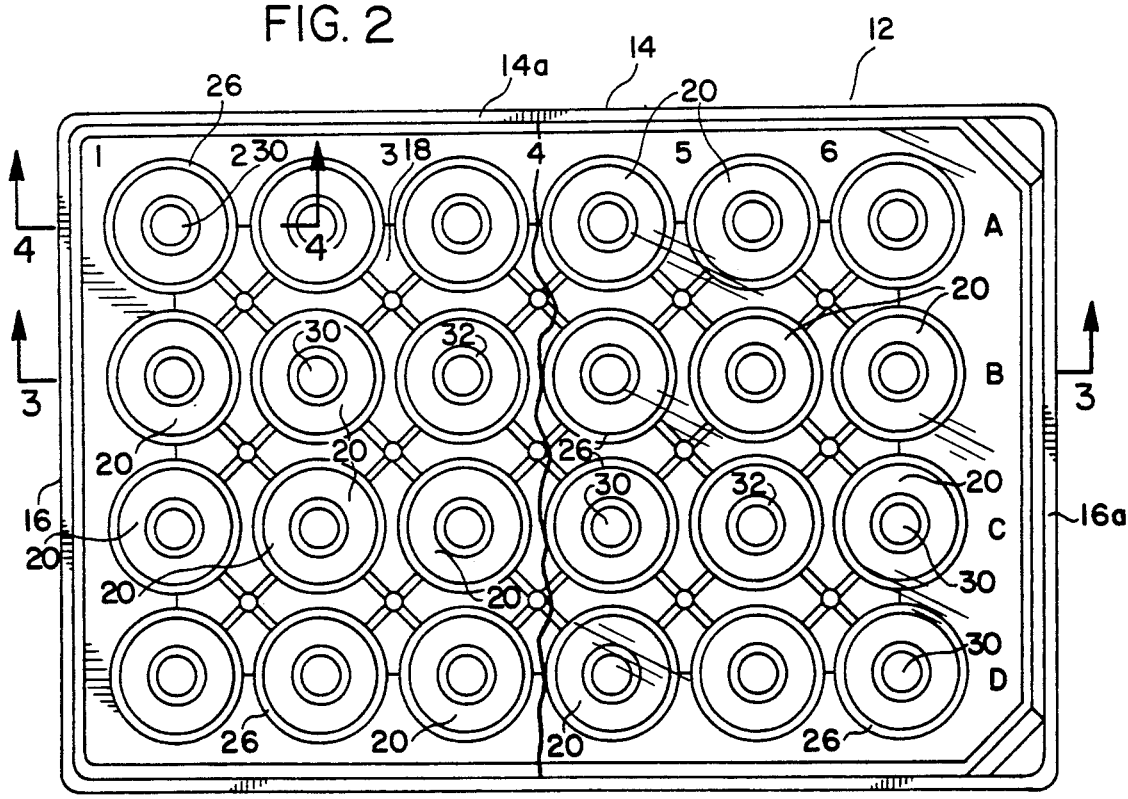
FIG. 2 is plan view of the apparatus.

In the embodiment of the invention shown in FIG. 1, the side and end walls, 14 and 16, are formed in a manner to provide a peripherally extending step 36 disposed between the upper and lower edges of the side and end walls 14 and 16. Such a step facilitates the stacking and handling of the apparatus of the invention during automated pipetting and crystal analysis steps.

Figure 4:
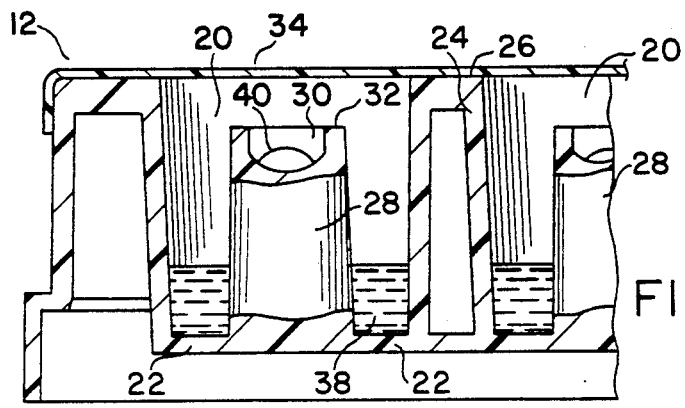
FIG. 4 is an enlarged fragmentary, cross-sectional view taken along lines 4—4 of FIG. 2.

In using the apparatus of the invention, each reservoir 20 is carefully filled with a selected equilibrating solution 38 so that the solution is contained within the annular shape defined by the side and bottom walls of each reservoir and the upstanding column 28 (FIGS. 3 and 4). It is to be observed that different equilibrating solutions can be added to each of the reservoirs 20 if this is desired. Typically, polyethylene glycol in high concentration (10 to 15%), or ammonium sulfate, is used as the precipitating agent in the equilibrating solution.

Following the addition of the equilibrating solution 38 to the reservoirs 20, a selected protein drop 40 is deposited within the receptacle 30 of each of the upstanding columns 20. The protein drop is typically 10 mg/ml of the protein in a buffered salt solution containing a lower concentration of the same precipitating agent used in the reservoir solution For example, the buffered salt solution may contain 5 to 7.5% polyethylene glycol. It is to be understood that the configuration of each of the receptacles 30 can be formed of an optimum size and shape to accommodate the particular protein drop being crystallized. For example, when lower surface tension solutions, including protein solutions containing detergents are used, a cup-shaped receptacle has proven satisfactory. Further, the texture of the walls of the receptacle can be varied to obtain optimum results for the particular protein solution being crystallized. In all cases, the non-wetting characteristic of the polystyrene plastic material from which the receptacle is formed significantly aids in the formation of protein solution drops of optimum configuration.

It is to be understood that the equilibrating solution as well as the protein drops can be added to the apparatus either by hand or by sophisticated automated pipetting apparatus which is readily commercially available. Because of the novel construction of the apparatus and the systematic placement of the reservoirs and protein drop receptacles, the apparatus is readily adaptable to most commercially available pipetting systems.

Once the equilibrating solution and protein drops have been added to the apparatus in the manner shown in FIGS. 3 and 4, the cover means 34 is carefully placed over the apparatus so that the top walls of the sides and edges of the apparatus as well as the top walls of each of the equilibrating solution reservoirs are positively sealed relative to atmosphere. With this arrangement, it is apparent that each protein drop is positively sealed within each reservoir 20 and can equilibrate against the particular equilibration solution which was earlier deposited into the particular reservoir. Since the starting concentration of precipitating agent is always higher in the reservoir than in the protein drop, once the chamber is sealed, water will diffuse from the protein drop to the reservoir until the concentration of precipitating agent at equilibrium is the same in the drop as in the reservoir. This diffusion results in a controlled steady increase in the concentration of both the protein and precipitating agent within the drop which forces the protein to come out of solution, hopefully as a crystal.

Following crystallization of the protein drops, the crystals can be analyzed within the apparatus, or after removal of the cover 34, the crystals can be removed from the apparatus for analysis in any appropriate manner.

Figure 5:
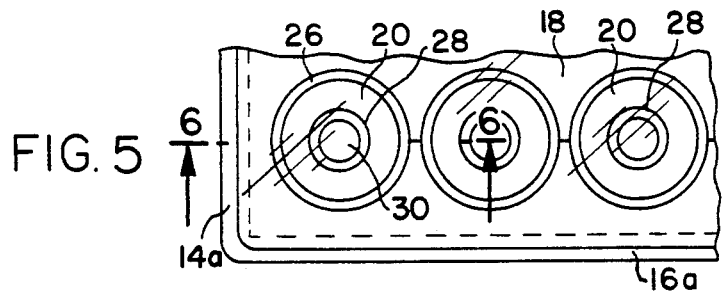
FIG. 5 is a fragmentary view of a alternate embodiment of the apparatus of the present invention for growing protein crystals.
Figure 6:
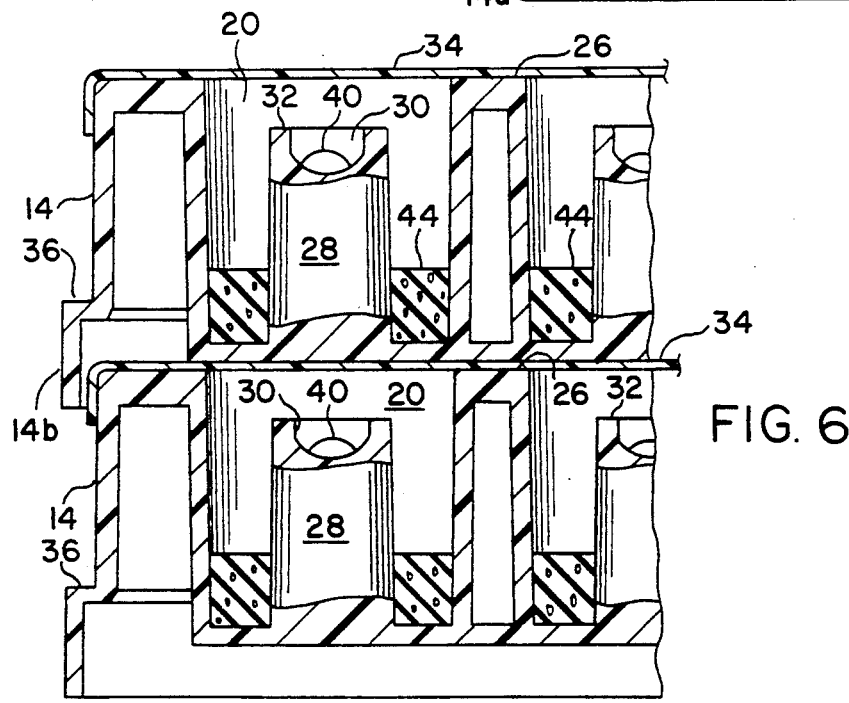
FIG. 6 is a greatly enlarged fragmentary crosssectional view taken along lines 6—6 of FIG. 5.

Referring now to FIGS. 5 and 6, an alternate form of the apparatus of the present invention is there illustrated. In this embodiment of the invention, the construction of the basic apparatus is identical to that previously described and like numerals have been used to identify like components. As best seen in FIG. 6, in this second embodiment of the invention, porous means shown here in the form of a porous plastic material is placed within each of the equilibrating solution reservoirs 20. This plastic material, identified in the drawings by the numeral 44, is preferably formed in a generally annular shaped configuration which can be placed around columns 28 in the manner shown in FIG. 6. This porous, equilibrating solution absorbing means rests within each equilibrating reservoir in the manner shown in the drawings and is of porosity such that the equilibrating solution is substantially absorbed into the porous, or sponge-like plastic material, so that the apparatus can be conveniently transported without any danger of the equilibrating solution splashing into the receptacles 30 which contain the protein drops 40. Various types of plastic material can be used to form members 44, but a porous plastic material of a character similar to that manufactured by the Dow Chemical Company and sold under the name and style, STYROFOAM, has proven satisfactory.

The apparatus of the alternate form of the invention is used in much the same manner as the embodiment of the invention earlier described. However, in this instance, prior to adding the equilibrating solution to the apparatus, the annular shaped sponge-like members 44 are placed within each of the equilibrating solution reservoirs. Once members 44 are in place, the equilibrating solution is added to the reservoir in a quantity which can be readily absorbed by the porous means 44. The use of members 44 permits the apparatus to be filled with the reservoir solution prior to shipment to the end user.

As illustrated in FIG. 6, individual units of the apparatus of the invention can be conveniently stacked one on top of another following the addition of the equilibrating solution and protein drops and the sealing of the apparatus by the cover means 34. The step design of the apparatus is such a to enable a number of devices to be stacked one upon another in a highly stable configuration. As indicated in FIG. 6, because of the step construction of the end and side walls, a lower flange portion 14b and 16b of the side and end walls overlaps the adjacent apparatus in the manner illustrated in FIG. 6 thereby adding stability to the stacked units.

Having now described the invention in detail in accordance with the requirements of the patent statutes, those skilled in this art will have no difficulty in making changes and modifications in the individual parts or their relative assembly in order to meet specific requirements or conditions. Such changes and modifications may be made without departing from the scope and spirit of the invention, as set forth in the following claims.

We claim:

1. An apparatus for growing protein crystals comprising:
    (a) a plurality of equilibrating solution reservoirs each having a bottom wall and an inclosing side wall so fixed in said apparatus as to terminate in a top disposed in a first plane;
    (b) a drop supporting means for supporting a protein drop disposed within each of said equilibrating solution reservoirs, each said drop supporting means comprising an upstanding column spaced apart from said side wall and having a protein solution depression disposed on the top thereof, the top of said protein solution depression being located below and parallel said first plane; and
    (c) cover means for engagement with said top of said equilibrating solution reservoirs for sealing said reservoirs wherein each of said protein solution depressions is in communication only with said equilibrating reservoir within which it is disposed.

2. An apparatus as defined in claim 1 in which said protein solution receptacle is generally cup shaped and formed from a plastic material.

3. An apparatus as defined in claim 1 in which said cover means comprises a thin sheet of transparent material provided with an adhesive for sealable engagement with said top of each of said equilibrating solution reservoirs.

4. An apparatus as defined in claim 1 in which each of said equilibrating solution reservoirs is circular in cross-section.

5. An apparatus as defined in claim 4 in which each of said columns is generally circular in cross-section.

6. An apparatus as defined in claim 5 in which said bottom wall of each of said equilibrating solution reservoirs is formed with said column by molding.

7. An apparatus for growing protein crystals, comprising:
    (a) interconnected side and end walls defining an enclosure, said walls terminating in a top edge disposed within a first plane;
    (b) a plurality of equilibrating solution reservoirs formed interiorly of said enclosure; each said reservoir including a bottom wall and an upstanding inclosing side wall terminating in an edge disposed within said first plane;

(c) an upstanding column disposed within each of said equilibrating solution reservoirs, each said column having a generally cup shaped protein solution carrying receptacle having a wall terminating in an edge disposed in a second plane, said second plane being spaced below said first plane and parallel to said first plane; and, (d) a sealable cover for engagement with said edges of said side and end walls and for engagement with said edges of each of said reservoirs wherein each said protein solution carrying receptacle is in communication only with said equilibrating reservoir within which it is disposed.

8. An apparatus as defined in claim 7 in which each said column is integrally formed with said bottom wall of said reservoir within which said column is disposed.

9. An apparatus as defined in claim 7 in which said side walls, said end walls, said equilibrating solution reservoirs and said columns are integrally formed from a polystyrene.

10. An apparatus as defined in claim 7 in which each of said side and edge walls includes an expansion away from respective side and edge walls, the tops of each said expansion disposed a third plane spaced below said first plane so more than one of said apparatus can be placed in stackable arrangement with the bottom edges of said expansion of the upper apparatus of a stack being in surrounding contact with the top of said side and end walls of the next lower apparatus.

11. An apparatus as defined in claim 7 further including porous means disposed within each said equilibrating solution reservoir for absorbing the equilibrating solution.

12. An apparatus as defined in claim 11 in which said porous means comprises annular shaped members constructed from a porous plastic foam.

* * * * *